Figure 1:
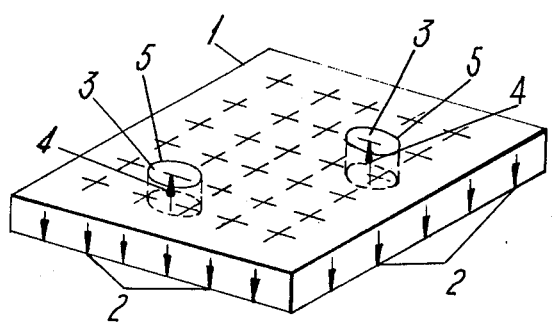

United States Patent [19] [11] 3,979,736
Marsh [45] Sept. 7, 1976

[54] CIRCULAR MAGNETIC DOMAIN DEVICES
[75] Inventor: Anthony Marsh, Blisworth, England
[73] Assignee: Plessey Handel und Investments A.G., Beeston Nottingham, England
[22] Filed: July 18, 1974
[21] Appl. No.: 489,816

Related U.S. Application Data
[63] Continuation-in-part of Ser. No. 293,755, Sept. 29, 1973, abandoned.

[30] Foreign Application Priority Data
Oct. 7, 1971 United Kingdom............... 46623/71

[52] U.S. Cl............................................ 340/174 TF
[51] Int. Cl.²....................................... G11C 11/14
[58] Field of Search.............................. 340/174 TF

[56] References Cited
UNITED STATES PATENTS
3,506,974  4/1970  Le Craw et al. .............. 340/174 TF OTHER PUBLICATIONS
IEEE Transactions on Magnetics—vol. Mag.–6; No. 3, Sept. 1970, pp. 558–563.

Primary Examiner—James W. Moffitt
Attorney, Agent, or Firm—Scrivener, Parker, Scrivener & Clarke

[57] ABSTRACT

A circular magnetic domain device which includes a layer of a polycrystalline or amorphous uniaxial magnetic material having a single unique easy magnetisation direction substantially normal to a major surface thereof and crystallites of a maximum diameter that is at least one order of magnitude less than the width of the wall of circular magnetic domains that are to be generated, and caused to propagate in the layer. The crystallites of this diameter ensure a high lateral magnetic domain mobility within the layer. This layer can be formed with a relatively large surface area by any known process for example vapor phase deposition on a surface of the substrate.

20 Claims, 2 Drawing Figures

CIRCULAR MAGNETIC DOMAIN DEVICES

This application is a continuation-in-part of application Ser. No. 293,755 filed Sept. 29, 1973 and now abandoned.

The invention relates to circular magnetic domain devices.

Known circular magnetic domain devices include a thin layer of uniaxial magnetic material, for example, orthoferrite, which possesses a single unique easy magnetisation direction that is substantially normal to the thin magnetic layer. It is possible for the thin magnetic layer to possess a positive magnetic vector at all points except for a few small circular regions, called magnetic domains or magnetic bubbles, within which the magnetic vector is negative. It should be noted that the polarities positive and negative are only arbitrarily assigned. The cylindrical internal surface forming the boundary between each of the magnetic domains and the remainder of the magnetic material of the thin layer are termed domain walls, or, more explicitly, 180° Bloch walls. The magnetic domains or bubbles are nucleated and made to propagate within the thin magnetic layer in a manner which is described by A. H. Bobeck et al. in the I.E.E.E. Transactions on Magnetics, Volume MAG. 5, No. 3 September, 1969 at pages 544 to 565.

Magnetic shift registers and magnetic serial information stores can be based on circular magnetic domains since these domains have the important properties that they are permanent and maintain a consistent size and that they possess high lateral mobility across the thin layer of magnetic material, and they can, therefore, move at high speeds when subjected to a magnetic field gradient. If the binary value "1" is assigned to the presence of a circular magnetic domain at a certain position and time, and the binary value "0" is assigned to the absence of a circular magnetic domain at that certain position and time; then the flow of binary information across the thin magnetic layer will correspond to the linear flow of a binary pattern of circular magnetic domains across the layer. The binary information can be processed in a variety of magnetic ways and ultimately the binary information is converted by a readout arrangement into electrical impulses which are utilised for a variety of purposes, for example, for the transmitting of the binary information over distances too great to be spanned by the thin magnetic layer.

In the known circular magnetic domain devices outlined in the preceding paragraphs, the thin layer of uniaxial magnetic material within which the circular magnetic domains are generated and caused to propagate along a predetermined path or paths, is a single crystal layer, and therefore, the surface area of the uniaxial magnetic layer is not very great. This limitation in surface area causes restrictions on the number and/or length of the circular magnetic domain propagation path or paths that can be provided in a single device.

The invention provides a circular magnetic domain device which includes a layer of a polycrystalline or amorphous uniaxial magnetic material formed on a surface of a substrate, the layer having a single unique easy magnetisation direction substantially normal to a major surface thereof, and crystallites of a maximum diameter that is at least one order of magnitude less than the width of the wall of circular magnetic domains that are to be generated in, and caused to propagate in, the layer. The layer of polycrystalline or amorphous uniaxial magnetic material can be formed with a relative large surface area by any known process, for example a vapour phase deposition or electroplating process, on the substrate surface. The substrate can either be an electrical insulator or conductor depending upon the degree of importance that eddy currents developed in the substrate would assume at high propagation velocities of the circular magnetic domains.

Figure 2:
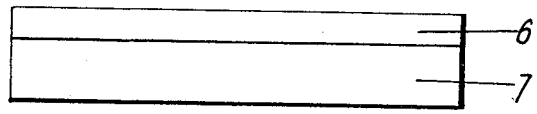
Figure 3:
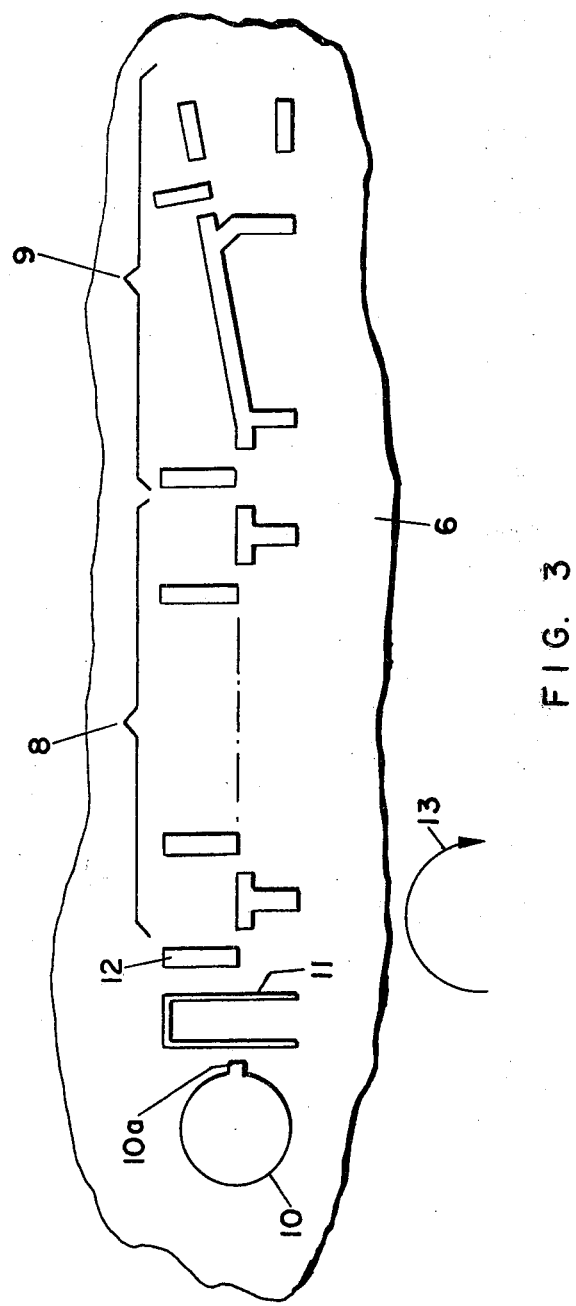

The foregoing and other features according to the invention will be better understood from the following description with reference to the accompanying drawings in which:

FIG. 1 diagrammatically illustrates the basic principles of a circular magnetic domain device, FIG. 2 diagrammatically illustrates in a side elevation part of a circular magnetic domain device according to the invention, and FIG. 3 diagrammatically illustrates a circular magnetic domain device according to the invention.

Referring to FIG. 1 of the drawings, which illustrate the basic principles of a circular magnetic domain device a thin layer 1 of uniaxial magnetic material, for example, orthoferrite, is illustrated which possesses a single unique easy magnetisation direction substantially normal to the layer. It is possible, as previously stated, for the magnetic layer 1 to possess a positive magnetic vector 2 at all points except for a few small circular regions 3, called magnetic domains, within which the magnetic vector 4 is negative. The cylindrical internal surface 5 forming the boundary between the domains 3 and the remainder of the material of the layer 1 forms a domain wall, or more explicitly, a 180° Bloch wall. As previously stated, the polarities positive and negative are arbitrarily assigned and should, therefore, not be considered as a limitation.

Referring to FIG. 2 of the drawings, part of a circular magnetic domain device according to the invention is diagrammatically illustrated therein in a side elevation. In this device, the thin uniaxial magnetic layer 6 is provided by a polycrystalline or amorphous uniaxial magnetic layer, having a single unique easy magnetisation direction substantially normal to a major surface thereof. The layer 6 can be formed by any known process, for example a vapour phase deposition or electroplating process, on a major surface of a substrate 7. The substrate 7 can, at least at the said major surface thereof, be of a polycrystalline or amorphous material and can be an electrical insulator or electrical conductor depending upon the degree of importance that eddy currents developed in the substrate would assume at high propagation velocities of the circular magnetic domains.

Typical substrate materials are copper, glass or a plastics material.

The thickness of the layer 6 is substantially the same as the diameter of the circular magnetic domains that are to be generated and caused to propagate therein.

The single unique easy magnetisation direction of the layer 6 which as previously stated is substantially normal to the major surface thereof, can in practice be provided in a variety of ways, for example, the single unique easy magnetisation direction can arise from any one of, or a combination of, the following sources:

a. in a polycrystalline layer 6, by a preferred orientation of the crystallites which constitute the layer and which will individually possess a pronounced single unique easy magnetisation direction. This easy magnetisation direction of the layer crystallites can be imparted by, for example, the epitaxial effects of the substrate 7 or by the directional effects of a thermal gradient or stress pattern which would be applied to the layer 6 during and/or after its formation on the substrate 7.

b. in either a polycrystalline or amorphous layer 6, by the direct induction of an easy magnetisation direction utilising a stress pattern applied to the layer during and/or after its formation on the substrate 7.

c. in either a polycrystalline or amorphous layer 6 by the direct induction of an easy magnetisation direction utilising a magnetic field applied in a direction normal to the major surface of the layer during its formation on the substrate 7. Alternatively, the magnetic field in combination with an increase in temperature can be applied for a certain period of time after the formation of the layer 6 on the substrate 7. This alternative process is known generally as magnetic annealing.

The substrate 7 could be formed by a single crystal electrically conductive or electrically insulating material and the anisotropy of the single crystal substrate would result in the layer 6, after formation, having a single unique easy magnetisation direction of the desired orientation.

In order to provide a suitable polycrystalline or amorphous uniaxial magnetic layer 6 which can support circular magnetic domains and be utilised in magnetic storage devices and data processers it is further necessary to ensure that the single unique easy magnetisation direction is sufficiently pronounced so as to promote the necessary stability to the circular magnetic domains generated and caused to propagate within the layer, but at the same time sufficiently weak so as to allow the previously mentioned domain wall to be of a width which is large i.e. by a factor of 10 or more, compared to the diameter of the largest magnetic layer crystallite, thereby ensuring that the circular magnetic domains will possess a high lateral mobility in the layer 6. In amorphous materials, the distance through which crystallographic order is maintained should be regarded as the effective crystallite diameter. In practice, a domain wall width would for example be about $0.1 \mu m$ and with this example the crystallite size would be $0.014 \mu m$ or smaller.

The required process parameters for effecting the formation of a layer of magnetic material having crystallites of the specified size are outlined below but it should, however, be noted that there is not just one group of process parameters which can be specified in order to control the ratio of the crystallite size to the domain wall width.

Crystallite size is dependent on one group of parameters, domain wall width is dependent on another group of parameters. Some of the parameters of each group may, however, be common to both groups.

To control the ratio there is only one course of action which is possible and this involves the following steps:
1. the preparation of a trial material,
2. measuring the crystallite size of the trial material, by, for example, the known X-ray method,
3. measuring the domain wall width by, for example, magnetic resonance and Curie point measurements,
4. obtaining the ratio for the trial material from the results of steps (2) and (3), and
5. deciding which of the crystallite size and the domain wall width should be altered to bring the ratio into the desired range of values.

It is known that the 180°domain wall width is readily expressed in terms of the materials magnetic parameter as follows:

$$W = \text{constant} \sqrt{\frac{T_c}{K}}$$

where
the magnitude of the constant is actually slightly different in the cases of different types of materials but would remain substantially constant despite changes in the proportions of constituents of one type of material,
$T_c$ is the Curie temperature of the material which can be readily determined, and
$K$ is the uniaxial magnetic anisotropy energy of the material and can be measured with a torsion balance or by means of magnetic resonance.

Generally there is relatively little scope in practice for altering the domain wall width compared with the scope for altering the crystallite size. This is because the parameters $T_c$ and $K$ which determine domain wall width also contribute to determining the diameter of the magnetic domains.

As is well-known in the art, the domain wall width can be reduced either by decreasing $T_c$ by increasing the proportion of the non-magnetic impurity in the material, or by increasing $K$ by increasing the occurrence of atomic pair ordering in the material. Pair ordering is enhanced if a lower film preparation temperature is employed.

The crystallite size may be reduced (increased) by intensifying (alleviating) the conditions, which are well known in the art and given below, and which favour the amorphous form rather than the coarsely crystalline form in the film that is to support magnetic domains.

An amorphous form of an alloy or compound tends to result if parameter values within certain ranges are chosen for the preparation. At this stage it is possible to neither generalize nor guarantee that an amorphous form will result but the more the conditions favour the amorphous state, the lower will be the crystallite size.

Amorphous materials will not readily form with a single element constituency. Binary and ternary mixtures are required because an amorphous form is favoured by:
i. the incorporation of a constituent at a level of at least 5 atomic percent which also bears a Goldsmit atomic radius appreciably different from that of the majority constituent. An appreciable difference here may be taken to be represented by an atomic radius ratio of either greater than 1.10 or less than 0.90. Data for the atomic radii of the majority of elements are catalogued and well-known.
ii. the incorporation of a constituent at a level of at least 5 atomic percent which tends to form covalent chemical bonds with atoms of the majority constituent.

Magnetic domain materials will have as their majority constituent a choice of elements from the first transition chemical series or from the rare earth group and so covalent bonding to a minority constituent requires that the minority constituent be chosen from oxygen, the sulphur group (S, Se, Te), group IV (C, Si, Ge, Sn) or group V (N, P, As, Sb).

If the film which is to support magnetic domains, is formed by electrodeposition or electroless deposition a well known minor constituent is phosphorus which is introduced by having a compound which may liberate phosphorus (e.g. hypophosphorus acid) in the plating bath. It is well-known that the proportion of phosphorus in the material should be at least 5 per cent and that a bath pH of greater than 8 and a temperature of greater than 70°C is necessary to result in sufficient hypophosphorus acid decomposition to liberate phosphorus (see for example, B. G. Bagley and D. Turnbull, Journal of Applied Physics 39, 13, pp. 5681–5685 (1968).

In vacuum deposition of the magnetic domain film a rapid deposition and a substrate held at a relatively low temperature favours small crystallite size and an amorphous form.

The presence of oxygen and/or nitrogen in the vacuum chamber favours the amorphous form because oxygen and nitrogen become incorporated as a minor constituent in the material. The higher the partial pressure of these gases, the smaller the resultant crystallite size.

The polycrystalline or amorphous uniaxial magnetic layer 6 can consist of any chemical compound with the appropriate magnetic characteristics, for example a metal alloy or an oxide, providing the conditions and instructions outlined in preceding paragraphs are satisfied.

The magnetic domains can, as is described in detail in the previously cited I.E.E.E. Transactions, be caused to propagate along the magnetic layer 6 of FIG. 2 by the use of a permeable circuit that would in practice be constituted by a pattern of soft magnetic material, for example, isotropic Permalloy, formed on a major surface of the magnetic layer 6, the soft magnetic pattern defining a propagation path or paths for the magnetic domains. This pattern which is illustrated in FIG. 3 of the drawings by the reference 8, is called a T-BAR overlay pattern because of the arrangement of the magnetic bars which form the pattern. The manner in which propagation is effected is described in the cited I.E.E.E. Transactions, and it will, therefore, not be described in any detail in this specification. It should, however, be noted that the circular magnetic domain device according to the present invention is not limited to the use of a T-BAR overlay to effect propagation, this pattern configuration is given by way of example only and other pattern configurations and propagation methods are possible which, will be evident and/or known to a person skilled in this particular art.

In general, the principle of propagation by means of a travelling wave in a permeable circuit can be regarded as being based on the attraction of the individual magnetic domains to a magnetic pole concentrated (of a certain sign) in the permeable circuit. The pole concentrations can, in response to a variation of an applied magnetic field, for example an applied rotating field, be made to either move smoothly or re-appear at discrete intervals along a propagation path of the permeable circuit.

The generation of the magnetic domains can, as is described in detail in the previously cited I.E.E.E. Transactions, be effected either by the use of conducting loops or by the use of a pattern of soft magnetic material, for example, isotropic Permalloy, which would be formed on a major surface of the layer 6, at that position i.e. adjacent to the start of the propagation path defined by, for example, the T-BAR overlay, where magnetic domain generation is to be effected. As is illustrated in FIG. 3, the latter magnetic domain generation method utilises, at the generation position, a disc 10 of the soft magnetic material that is formed on the layer 6 and has, in practice, a permanent magnetic domain associated with it which stays in contact with a positive pole formed on the disc by a transverse magnetic field which is rotated in the direction of the arrow 13. As the magnetic field associated with the disc rotates, the discs' magnetic domain also rotates and at some point during rotation attaches itself to the propagation paths magnetic pattern via a conductor loop 11 and an I-shaped soft magnetic element 12. In practice, a current pulse is applied to the loop 11 and when the circulating domain reaches the projection 10a of the disc 10, the bubble expands and comes under the influence of the magnetic pole induced in the element 12 by the rotating magnetic field. As the magnetic field continues rotation after the magnetic domain has become attached to the propagating paths magnetic pattern, the magnetic domain is stretched until it ruptures into two portions. One of the portions remains on the disc and can be used to generate further domains whilst the other portion remains in the propagation path. Both portions then returned to a magnetic domain size which is determined by the bias field.

A conductor loop placed near to the magnetic layer 6 can be utilised as a read-out arrangement to convert the binary information which is in the form of the circular domains, into information in the form of electrical impulses and the basic principles of operation of this read-out arrangement is exactly that of electro-magnetic induction. Alternatively, as is illustrated in FIG. 3, the read-out arrangement which is the subject of our U.S. Pat. No. 3,731,288 could be utilised to convert the binary information into electrical impulses.

It is to be understood that the foregoing description of specific examples of this invention is made by way of example only and is not to be considered as a limitation in its scope.

What is claimed is:

1. A circular magnetic domain device which includes a layer of polycrystalline or amorphous uniaxial magnetic material formed on a surface of a substrate, the layer having a single unique easy magnetisation direction substantially normal to a major surface thereof, and crystallites of a diameter that is at least one order of magnitude less than the width of a wall of circular magnetic domains that are to be generated in and caused to propagate in, the layer, the maximum diameter of said crystallites not being greater than 0.01 $\mu$m.

2. A circular magnetic domain device as claimed in claim 1 wherein the thickness of the uniaxial magnetic layer is substantially the same as the diameter of the said circular magnetic domains.

3. A circular magnetic domain device as claimed in claim 1 wherein the material of the uniaxial magnetic layer is a metal alloy.

4. A circular magnetic domain device as claimed in claim 1 wherein the material of the uniaxial magnetic layer is an oxide.

5. A circular magnetic domain device as claimed in claim 1 which also includes generating means for generating circular magnetic domains within the said layer; propagation means which define at least one propagation path in the said layer along which the generated circular magnetic domains can be caused to propagate; and a read-out arrangement for converting the circular magnetic domains into electrical impulses.

6. A circular magnetic domain device as claimed in claim 1 wherein the substrate is of an electrically conductive material.

7. A circular magnetic domain device as claimed in claim 6 wherein the substrate is of a single crystal material.

8. A circular magnetic domain device as claimed in claim 6 wherein the substrate is of copper.

9. A circular magnetic domain device as claimed in claim 1 wherein the substrate is of an electrically insulating material.

10. A circular magnetic domain device as claimed in claim 9 wherein the substrate is of a single crystal material.

11. A circular magnetic domain device as claimed in claim 9 wherein the substrate is a material selected from the group which comprises glass and plastics material.

12. A method of producing a circular magnetic domain device which includes the steps of forming a layer of a polycrystalline or amorphous uniaxial magnetic material on a surface of a substrate such that the said layer has a single unique easy magnetisation direction substantially normal to a major surface thereof, and crystallites of a diameter that is at least one order of magnitude less than the width of the wall of circular magnetic domains that are to be generated in, and caused to propagate in, the said layer, the maximum diameter of said crystallites not being greater than 0.01 μm.

13. A method as claimed in claim 12 wherein the single unique easy magnetisation direction of the said layer is imparted by applying a stress pattern to the said layer during and/or after layer formation, the directional effects of the stress pattern giving rise to the magnetisation direction.

14. A method as claimed in claim 12 wherein the single unique easy magnetisation direction of the said layer is imparted by forming the said layer on a single crystal substrate.

15. A method as claimed in claim 12 wherein the material of the said layer is polycrystalline and wherein the layer is formed such that the crystallites of the material each possess a pronounced single unique easy magnetisation direction and are orientated to provide the single unique easy magnetisation direction for the said layer.

16. A method as claimed in claim 15 wherein the said layer is formed on the substrate surface by an epitaxial process and wherein the single unique easy magnetisation direction of the layer crystallites is imparted by the epitaxial effects of the substrate.

17. A method as claimed in claim 15 wherein the single unique easy magnetisation direction of the layer crystallites is imparted by applying a thermal gradient to the said layer during and/or after layer formation, the directional effects of the thermal gradient giving rise to the magnetisation direction.

18. A method as claimed in claim 15 wherein the single unique easy magnetisation direction of the individual crystallites of the said layer is imparted by applying a stress pattern to the said layer during and/or after layer formation, the directional effects of the stress pattern giving rise to the magnetisation direction.

19. A method as claimed in claim 12 wherein the single unique easy magnetisation direction of the said layer is imparted by applying a magnetic field to the said layer in a direction normal to the said major surface thereof, either during or after layer formation.

20. A method as claimed in claim 19 wherein the magnetic field is applied whilst the said layer is being heated.

* * * * *